United States Patent
Cho et al.

(10) Patent No.: US 12,538,656 B2
(45) Date of Patent: Jan. 27, 2026

(54) DISPLAY APPARATUS WITH OVERLAPPING CONTACT HOLES FOR CONDUCTIVE LAYER IN NON-DISPLAY AREA

(71) Applicant: Samsung Display Co., Ltd., Yongin-si (KR)

(72) Inventors: Seunghwan Cho, Yongin-si (KR); Kinyeng Kang, Yongin-si (KR); Taewoo Kim, Yongin-si (KR); Taehyun Kim, Yongin-si (KR); Taehoon Yang, Yongin-si (KR); Cheolgon Lee, Yongin-si (KR); Jonghyun Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 992 days.

(21) Appl. No.: 17/671,244

(22) Filed: Feb. 14, 2022

(65) Prior Publication Data
US 2022/0285647 A1    Sep. 8, 2022

(30) Foreign Application Priority Data

Mar. 5, 2021    (KR) ........................ 10-2021-0029656

(51) Int. Cl.
*H10K 59/122*    (2023.01)
*H10K 59/121*    (2023.01)
(Continued)

(52) U.S. Cl.
CPC ......... *H10K 59/122* (2023.02); *H10K 59/121* (2023.02); *H10K 59/131* (2023.02); *H10K 59/8731* (2023.02)

(58) Field of Classification Search
CPC .. H10K 59/122; H10K 59/131; H10K 59/121; H10K 59/8731; H10K 50/844
See application file for complete search history.

(56) References Cited

U.S. PATENT DOCUMENTS 9,391,296 B2    7/2016  Park et al.
9,412,972 B2 *  8/2016  Shim .................... H10K 59/122
(Continued)

FOREIGN PATENT DOCUMENTS

KR    10-2015-0025994 A    3/2015
KR    10-2016-0032800 A    3/2016
(Continued)

*Primary Examiner* — Lex H Malsawma
(74) *Attorney, Agent, or Firm* — Womble Bond Dickinson (US) LLP

(57) ABSTRACT

A display apparatus includes: a plurality of pixels on a substrate and each including a first electrode, an intermediate layer, and a second electrode, the intermediate layer including an emission layer; a display area including the plurality of pixels; a first conductive layer outside the display area; a first planarization layer including a first contact hole exposing an upper surface of the first conductive layer, and a second contact hole between the display area and the first contact hole; a second conductive layer connected to the first conductive layer through the first contact hole; a second planarization layer on the first planarization layer and including a third contact hole formed at a position overlapping the second contact hole; and a connection layer directly contacting the second conductive layer at a position where the second contact hole and the third contact hole overlap each other.

24 Claims, 18 Drawing Sheets

(51) Int. Cl.
*H10K 59/131* (2023.01)
*H10K 59/80* (2023.01)

(56) References Cited

U.S. PATENT DOCUMENTS

| | | |
|---|---|---|
| 10,170,534 B1 | 1/2019 | Kim et al. |
| 10,439,165 B2 | 10/2019 | Kim et al. |
| 10,777,771 B2 | 9/2020 | Lee et al. |
| 11,088,232 B2* | 8/2021 | Choi .................... H10K 59/131 |
| 11,196,023 B2 | 12/2021 | Seo et al. |
| 11,462,605 B2 | 10/2022 | Han et al. |
| 2018/0033830 A1 | 2/2018 | Kim et al. |
| 2018/0151838 A1* | 5/2018 | Park ..................... H10K 59/131 |
| 2019/0148469 A1* | 5/2019 | Lhee .................... H10K 50/844 |
| | | 257/40 |
| 2020/0185647 A1* | 6/2020 | Lee .................... H10K 59/8722 |
| 2021/0043715 A1* | 2/2021 | Han ....................... G06F 3/0446 |
| 2021/0119178 A1* | 4/2021 | Song ................. H10K 59/8791 |
| 2021/0257437 A1* | 8/2021 | Shin ....................... H10D 86/60 |

FOREIGN PATENT DOCUMENTS

| | | |
|---|---|---|
| KR | 10-2018-0013452 A | 2/2018 |
| KR | 10-2018-0014398 A | 2/2018 |
| KR | 10-2018-0054386 A | 5/2018 |
| KR | 10-2019-0031397 A | 3/2019 |
| KR | 10-2020-0071194 A | 6/2020 |
| KR | 10-2020-0120804 A | 10/2020 |
| KR | 10-2021-0017297 A | 2/2021 |

\* cited by examiner

DISPLAY APPARATUS WITH OVERLAPPING CONTACT HOLES FOR CONDUCTIVE LAYER IN NON-DISPLAY AREA

CROSS-REFERENCE TO RELATED APPLICATION

The present application claims priority to and the benefit of Korean Patent Application No. 10-2021-0029656, filed on Mar. 5, 2021, in the Korean Intellectual Property Office, the entire content of which is hereby incorporated by reference.

BACKGROUND

1. Field

Aspects of one or more embodiments relate to a display apparatus.

2. Description of the Related Art

Display apparatuses are apparatuses that visually display data. Recently, the usage of display apparatuses has become more diversified. Also, display apparatuses have become thinner and lighter, and thus, the various potential uses of display apparatuses have expanded.

A display apparatus includes a substrate partitioned into a display area and a non-display area outside the display area. The non-display area, in which non-display elements such as a pad portion, a plurality of wires, and a driving circuit portion are arranged, is a dead space at which images are not displayed. Recently, there has been an increased demand to further reduce the dead space of a display apparatus.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a display apparatus in which a dead space may be reduced and monomer overflow may be effectively controlled.

Aspects of one or more embodiments may include a display apparatus in which a high-quality image is provided by reducing a dead space and effectively controlling monomer overflow, and a method of manufacturing the display apparatus. However, embodiments according to the present disclosure are not limited thereto.

Additional aspects will be set forth in part in the description which follows and, in part, will be apparent from the description, or may be learned by practice of the presented embodiments of the disclosure.

According to one or more embodiments, a display apparatus includes a plurality of pixels arranged over a substrate and each including a first electrode, an intermediate layer, and a second electrode, the intermediate layer including an emission layer, a display area including the plurality of pixels, a first conductive layer arranged outside the display area, a first planarization layer including a first contact hole exposing an upper surface of the first conductive layer, and a second contact hole between the display area and the first contact hole, a second conductive layer connected to the first conductive layer through the first contact hole, a second planarization layer on the first planarization layer and including a third contact hole formed at a position overlapping the second contact hole, and a connection layer directly contacting the second conductive layer at a position where the second contact hole and the third contact hole overlap each other.

According to some embodiments, the second conductive layer may be in the first contact hole and between the first contact hole and the display area, wherein a width of the second conductive layer may be greater than a width of the first conductive layer.

According to some embodiments, the connection layer may directly contact the second electrode at the position where the second contact hole and the third contact hole overlap each other.

According to some embodiments, in the first contact hole, the connection layer may overlap the first conductive layer and the second conductive layer.

According to some embodiments, in the first contact hole, the connection layer may directly contact the second conductive layer.

According to some embodiments, in the first contact hole, the second planarization layer may be arranged between the connection layer and the second conductive layer.

According to some embodiments, the display apparatus may further include an organic insulating layer on the second planarization layer, a first dam including the first and second planarization layers and the organic insulating layer and covering one end of the first conductive layer, and a second dam including the first and second planarization layers and the organic insulating layer and covering another end of the first conductive layer.

According to some embodiments, a height from a surface of the substrate to a top of the second dam may be greater than a height from the surface of the substrate to a top of the first dam.

According to some embodiments, when the position where the second contact hole and the third contact hole overlap each other is referred to as a valley, a bank portion may be between the valley and the first dam, wherein the bank portion may include a plurality of convex portions including an organic insulating layer.

According to some embodiments, in a vertical cross-sectional view of the substrate, the bank portion may have a structure in which the first planarization layer, the second conductive layer including a first hole, the second planarization layer, the connection layer including a second hole, and the plurality of convex portions are sequentially stacked.

According to some embodiments, the first hole and the second hole may overlap each other in the vertical cross-sectional view of the substrate.

According to some embodiments, each of the plurality of convex portions may not be connected to other convex portions and may be spaced apart from the other convex portions in all directions.

According to some embodiments, each of the plurality of convex portions may not be connected to other convex portions and may be spaced apart from the other convex portions in all directions, wherein the second planarization layer may not be connected to another second planarization layer and may be spaced apart from the other second planarization layer in one direction.

According to some embodiments, each of the plurality of convex portions may not be connected to another convex portion and may be spaced apart from the other convex portion in one direction, wherein the second planarization layer may not be connected to another second planarization layer and may be spaced apart from the other second planarization layer in one direction.

According to some embodiments, in a vertical cross-sectional view of the substrate, the bank portion may have a structure in which the first planarization layer, the second conductive layer including a first hole, the connection layer including a second hole, and the plurality of convex portions are sequentially stacked.

According to some embodiments, the first hole and the second hole may be connected to each other to allow direct penetration.

According to some embodiments, when the position where the second contact hole and the third contact hole overlap each other is referred to as a valley, a bank portion may be between the valley and the first dam, wherein a third dam having a height greater than that of the bank portion may be further arranged between the valley and the bank portion.

According to some embodiments, the second planarization layer may constitute the third dam and the bank portion, wherein a height of the second planarization layer included in the third dam may be greater than a height of the second planarization layer included in the bank portion.

According to some embodiments, the display apparatus may further include a thin film encapsulation layer covering the display area, the thin film encapsulation layer including at least one inorganic encapsulation layer and at least one organic encapsulation layer.

According to some embodiments, the at least one inorganic encapsulation layer may include a first inorganic encapsulation layer and a second inorganic encapsulation layer, wherein the at least one organic encapsulation layer may be arranged between the first inorganic encapsulation layer and the second inorganic encapsulation layer.

According to some embodiments, the first inorganic encapsulation layer and the second inorganic encapsulation layer may directly contact each other outside the second dam.

According to one or more embodiments, a display apparatus includes a substrate, a display area over the substrate and including a plurality of pixels, a non-display area arranged outside the display area, a first dam surrounding the display area, a second dam arranged outside the first dam and surrounding the first dam, a power voltage line including a first conductive layer between the first dam and the second dam and a second conductive layer directly contacting the first conductive layer and having a width greater than that of the first conductive layer, and a third conductive layer directly contacting the second conductive layer in a valley where contact holes respectively formed in at least two insulating layers overlap each other between the display area and the first dam.

According to some embodiments, each of the plurality of pixels may include a first electrode, an emission layer arranged on the first electrode, and a second electrode arranged on the emission layer and commonly arranged in the plurality of pixels, wherein the second electrode may extend to the non-display area and directly contact the third conductive layer between the display area and the first dam.

According to some embodiments, a bank portion including a plurality of convex portions may be between the valley and the first dam, wherein the bank portion may have a height less than that of the first dam.

According to some embodiments, a third dam may be between the valley and the bank portion, wherein the third dam may have a height greater than that of the bank portion.

According to some embodiments, the display apparatus may further include a thin film encapsulation layer covering the display area, wherein the thin film encapsulation layer may include a first inorganic encapsulation layer, a second inorganic encapsulation layer, and an organic encapsulation layer between the first inorganic encapsulation layer and the second inorganic encapsulation layer, wherein the first inorganic encapsulation layer and the second inorganic encapsulation layer may directly contact each other outside the second dam.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
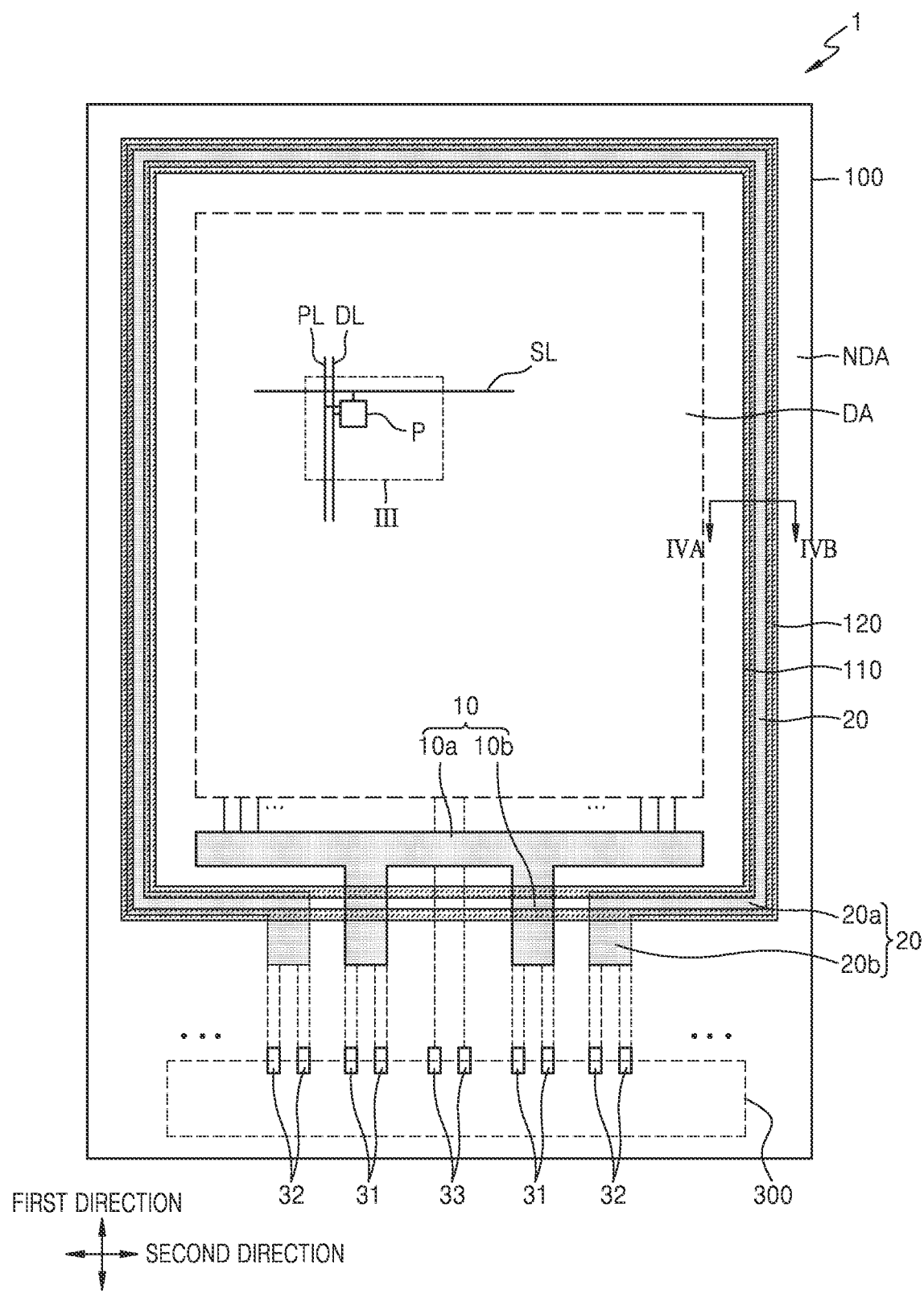
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, embodiments according to the present disclosure may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description of the one or more embodiments, taken in conjunction with the accompanying drawings. However, embodiments according to the present disclosure may have different forms and should not be construed as being limited to the descriptions set forth herein.

Aspects of one or more embodiments will be described below in more detail with reference to the accompanying drawings. Those elements that are the same or are in correspondence with each other are rendered the same reference numeral regardless of the figure number, and redundant descriptions thereof are omitted.

While such terms as "first" and "second" may be used to describe various elements, such elements must not be limited to the above terms. The above terms are used to distinguish one element from another.

The singular forms "a," "an," and "the" as used herein are intended to include the plural forms as well unless the context clearly indicates otherwise.

It will be understood that the terms "include," "comprise," and "have" as used herein specify the presence of stated features or elements but do not preclude the addition of one or more other features or elements.

It will be further understood that, when a layer, region, or element is referred to as being on another layer, region, or element, it may be directly or indirectly on the other layer, region, or element. That is, for example, intervening layers, regions, or elements may be present.

Sizes of elements in the drawings may be exaggerated or reduced for convenience of description. In other words, because sizes and thicknesses of elements in the drawings are arbitrarily illustrated for convenience of description, the following embodiments are not limited thereto.

When an embodiment may be implemented differently, a certain process order may be performed differently from the described order. For example, two consecutively described processes may be performed substantially at the same time or performed in an order opposite to the described order.

It will be further understood that, when layers, regions, or elements are referred to as being connected to each other, they may be directly connected to each other or indirectly connected to each other with intervening layers, regions, or elements therebetween. For example, when layers, regions, or elements are referred to as being electrically connected to each other, they may be directly electrically connected to each other or indirectly electrically connected to each other with intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

A display apparatus is an apparatus that displays an image, and may be a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode ray display apparatus, or the like.

Although an organic light-emitting display apparatus is described below as an example of a display apparatus according to some embodiments, a display apparatus described herein is not limited thereto, and various display apparatuses may be used.

Figure 2:
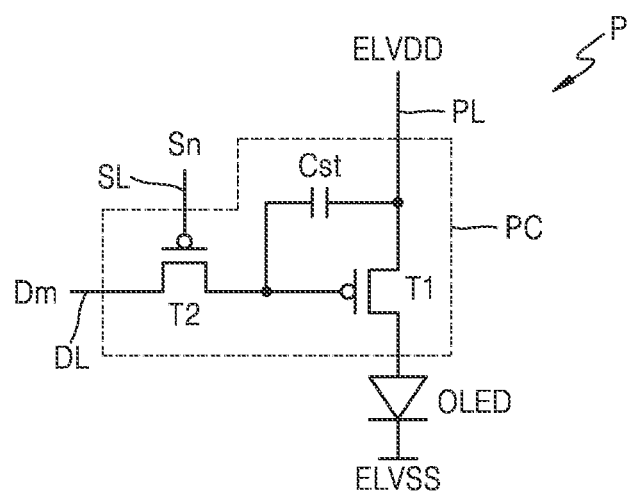
FIG. 2 is an example of an equivalent circuit diagram of a pixel included in the display apparatus according to some embodiments.
Figure 3:
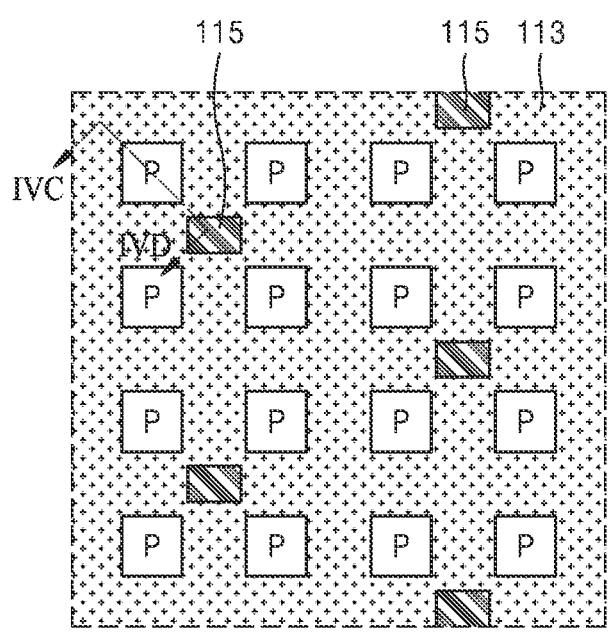
FIG. 3 is a schematic plan view of the region III of FIG. 1.
Figure 4:
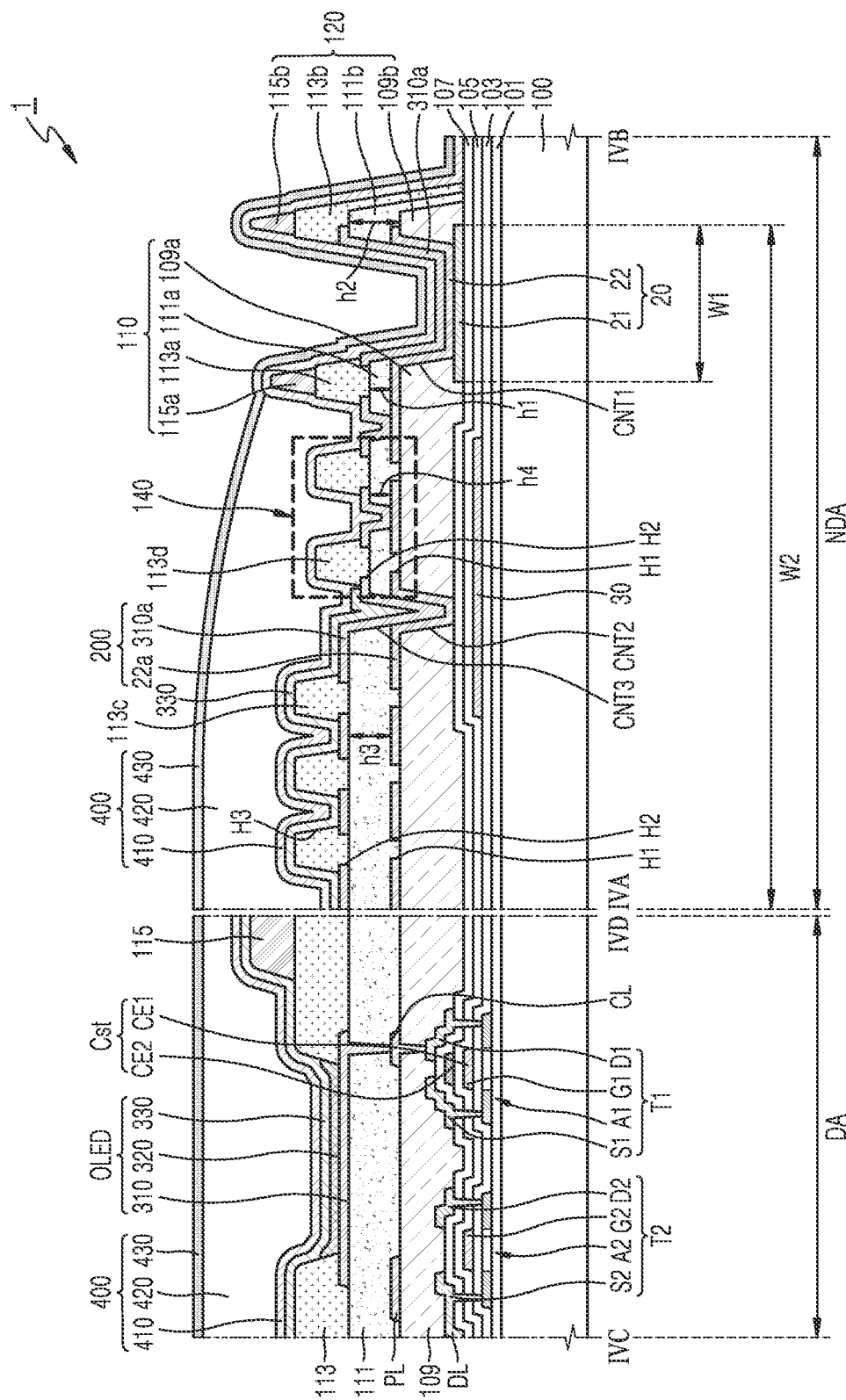
FIG. 4 is a schematic cross-sectional view of the display apparatus according to some embodiments, taken along the line IVA-IVB of FIG. 1 and line IVC-IVD of FIG. 3.

FIG. 1 is a schematic plan view of a display apparatus 1 according to some embodiments. FIG. 2 is an example of an equivalent circuit diagram of a pixel included in the display apparatus 1 according to some embodiments. FIG. 3 is a schematic plan view of the region III of FIG. 1. FIG. 4 is a schematic cross-sectional view of the display apparatus 1 according to some embodiments, taken along the line IVA-IVB of FIG. 1 and line IVC-IVD of FIG. 3.

Referring to FIG. 1, the display apparatus 1 includes a display area DA arranged over a substrate 100. The display area DA includes pixels P connected to a data line DL extending in a first direction and a scan line SL extending in a second direction crossing the first direction. Each pixel P may be connected to a driving voltage line PL extending in the first direction. Although FIG. 1 illustrates a single pixel P, a person having ordinary skill in the art may include any suitable number of a plurality of pixels P according to the size and design of the display apparatus 1.

A pixel P emits, for example, red, green, blue, or white light, and as an example, may include an organic light-emitting diode. In addition, devices such as a thin-film transistor and a capacitor may be further included in each pixel P.

The display area DA displays images through light emitted from each pixel P, and a non-display area NDA is arranged outside the display area DA. For example, the non-display area NDA may surround the display area DA. Thus, the non-display area NDA may be a bezel area in a periphery (e.g., outside a footprint) of the display area DA.

The non-display area NDA is an area in which the pixels P are not arranged, and does not display images. A first power voltage line 10 and a second power voltage line 20 configured to provide a different voltage from the first power voltage line 10 may be arranged in the non-display area NDA.

The first power voltage line 10 may include a first main voltage line 10a and a first connection line 10b arranged on one side of the display area DA. For example, when the display area DA has a rectangular shape, the first main voltage line 10a may be arranged to correspond to any side of the display area DA. The first connection line 10b extends in the first direction from the first main voltage line 10a. According to some embodiments, the first direction may be a direction from the display area DA toward a terminal portion 300 near an end of the substrate 100. The first connection line 10b may be connected to a first terminal 31 of the terminal portion 300.

The second power voltage line 20 may include a second main voltage line 20a partially surrounding both ends of the first main voltage line 10a and the display area DA, and a second connection line 20b extending in the first direction from the second main voltage line 20a. For example, when the display area DA has a rectangular shape, the second main voltage line 20a may extend along both ends of the first main voltage line 10a and the remaining sides except any one side of the display area DA adjacent to the first main voltage line 10a. The second connection line 20b extends in the first direction parallel to the first connection line 10b and is connected to a second terminal 32. The second power voltage line 20 may be bent to surround ends of the first power voltage line 10.

The terminal portion 300 is arranged on one end of the substrate 100 and includes a plurality of first to third terminals 31, 32, and 33. The terminal portion 300 may not be covered by an insulating layer but may be exposed and be electrically connected to a controller such as a flexible printed circuit board or a driving driver IC chip.

The controller may change a plurality of image signals transmitted from the outside into a plurality of image data signals and may transmit the changed signals to the display area DA through the third terminal 33. Also, the controller may receive a vertical synchronization signal, a horizontal synchronization signal, or a clock signal, generate a control signal for controlling driving of first and second gate drivers, and transmit the control signal to each of them through a terminal.

The controller may transfer different voltages to the first power voltage line 10 and the second power voltage line 20, respectively, through the first terminal 31 and the second terminal 32.

The first power voltage line 10 may provide a first power voltage ELVDD (of FIG. 2) to each pixel P, and the second power voltage line 20 may provide a second power voltage ELVSS (of FIG. 2) to each pixel P.

For example, the first power voltage ELVDD may be provided to each pixel P through the driving voltage line PL connected to the first power voltage line 10. The second power voltage ELVSS may be provided to a cathode of an organic light-emitting diode OLED (of FIG. 2) provided in each pixel P, and in this regard, the second main voltage line 20a of the second power voltage line 20 may be connected to the cathode of the organic light-emitting diode OLED in the non-display area NDA.

According to some embodiments, a scan driver for providing a scan signal to the scan line SL of each pixel P, a data driver for providing a data signal to the data line DL, and the like may be further arranged in the non-display area NDA.

In the non-display area NDA, a first dam 110 and a second dam 120 surrounding the display area DA may be spaced apart from each other.

When an organic encapsulation layer 420 (of FIG. 4) including an organic material such as a monomer constituting a thin film encapsulation layer 400 (of FIG. 4) is formed by an inkjet process, the first dam 110 and the second dam 120 may block the organic material from flowing to an edge of the substrate 100, thereby preventing or reducing instances of an edge tail due to the organic encapsulation layer 420 being formed at the edge of the substrate 100.

Referring to FIG. 2, each pixel P includes a pixel circuit PC connected to the scan line SL and the data line DL and the organic light-emitting diode OLED connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to transmit a data signal Dm input through the data line DL to the driving thin-film transistor T1 according to a scan signal Sn input through the scan line SL.

The storage capacitor Cst is connected to the switching thin-film transistor T2 and the driving voltage line PL and stores a voltage corresponding to a difference between a voltage received from the switching thin-film transistor T2 and the first power voltage ELVDD supplied to the driving voltage line PL.

The driving thin-film transistor T1 is connected to the driving voltage line PL and the storage capacitor Cst and may be configured to control a driving current flowing through the organic light-emitting diode OLED from the driving voltage line PL in response to a voltage value stored in the storage capacitor Cst. The organic light-emitting diode OLED may emit light having certain brightness according to the driving current.

Although FIG. 2 shows a case in which the pixel circuit PC includes two thin-film transistors and one storage capacitor, embodiments according to the present disclosure are not limited thereto, and the number and circuit design of thin-film transistors and storage capacitors may be variously modified.

Referring to FIG. 3, a plurality of pixels P are arranged in region III of FIG. 1. The plurality of pixels P may be surrounded by a pixel-defining layer 113, and a spacer 115 may be arranged on the pixel-defining layer 113.

Although FIG. 3 shows the pixels P in a quadrilateral shape of the same size, this is an example, and the pixels P may have different sizes, and shapes of the pixels P may also be different.

The spacer 115 is arranged between some pixels P from among the plurality of pixels P. The spacer 115 may maintain a gap between a mask and the substrate 100 during a process of depositing an intermediate layer 320 including an emission layer by using the mask and thus may prevent or reduce defects in which the intermediate layer 320 is stamped with or peeled off by the mask during the deposition process.

The spacer 115 may include the same material as the pixel-defining layer 113, and when the pixel-defining layer 113 is formed by using a halftone mask, the spacer 115 may be formed of the same material as the pixel-defining layer 113 and at a different height from each other.

A left side of FIG. 4 is a schematic cross-sectional view of the pixel P, taken along the line IVC-IVD of FIG. 3. Referring to the left side of FIG. 4, a buffer layer 101 is arranged on the substrate 100, and the driving thin-film transistor T1, the switching thin-film transistor T2, and the storage capacitor Cst is arranged on the buffer layer 101.

The substrate 100 may include various materials such as glass, metal, or plastic. For example, the substrate 100 may be a flexible substrate including polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate.

The buffer layer 101 including silicon oxide and/or silicon nitride may be provided on the substrate 100 to prevent or reduce penetration of impurities.

The driving thin-film transistor T1 includes a driving semiconductor layer A1 and a driving gate electrode G1, and the switching thin-film transistor T2 includes a switching semiconductor layer A2 and a switching gate electrode G2. A first gate insulating layer 103 may be arranged between the driving semiconductor layer A1 and the driving gate electrode G1 and between the switching semiconductor layer A2 and the switching gate electrode G2. The first gate insulating layer 103 may include an inorganic insulating material such as silicon oxide, silicon nitride, silicon oxynitride, etc.

The driving semiconductor layer A1 and the switching semiconductor layer A2 may include amorphous silicon or may include polycrystalline silicon. According to some embodiments, the driving semiconductor layer A1 and the switching semiconductor layer A2 may include oxide including at least one material selected from the group including indium (In), gallium (Ga), stannum (Sn), zirconium (Zr), vanadium (V), hafnium (Hf), cadmium (Cd), germanium (Ge), chromium (Cr), titanium (Ti), and zinc (Zn).

The driving semiconductor layer A1 may include a driving channel region overlapping the driving gate electrode G1 and not doped with impurities, and a driving source region and a driving drain region on both sides of the driving channel region and doped with impurities. A driving source electrode S1 and a driving drain electrode D1 may be connected to the driving source region and the driving drain region, respectively.

The switching semiconductor layer A2 may include a switching channel region overlapping the switching gate electrode G2 and not doped with impurities, and a switching source region and a switching drain region on both sides of the switching channel region and doped with impurities. A switching source electrode S2 and a switching drain electrode D2 may be connected to the switching source region and the switching drain region, respectively.

The driving gate electrode G1 and the switching gate electrode G2 may include molybdenum (Mo), aluminum (Al), copper (Cu), titanium (Ti), etc. and may have a single-layer or multi-layer structure.

The storage capacitor Cst may overlap the driving thin-film transistor T1. In this case, areas of the storage capacitor Cst and the driving thin-film transistor T1 may be increased, and a high-quality image may be provided. For example, the driving gate electrode G1 may be a first storage capacitive plate CE1 of the storage capacitor Cst. A second storage capacitive plate CE2 may be arranged above the first storage capacitive plate CE1 to overlap the first storage capacitive plate CE1. A second gate insulating layer 105 serving as a dielectric layer may be arranged between the first storage capacitive plate CE1 and the second storage capacitive plate CE2. The second gate insulating layer 105 may include an inorganic insulating material such as silicon oxide, silicon nitride, silicon oxynitride, etc.

The driving thin-film transistor T1, the switching thin-film transistor T2, and the storage capacitor Cst may be covered by an interlayer insulating layer 107. The interlayer insulating layer 107 may be an inorganic material layer such as silicon oxynitride, silicon oxide and/or silicon nitride.

The data line DL may be arranged on the interlayer insulating layer 107 and may be connected to the switching semiconductor layer A2 of the switching thin-film transistor T2 through a contact hole penetrating the interlayer insulating layer 107. The data line DL may serve as the switching source electrode S2.

The driving source electrode S1, the driving drain electrode D1, the switching source electrode S2, and the switching drain electrode D2 may be arranged on the interlayer insulating layer 107, may be formed of the same material and on the same layer during the same process, and may be connected to the driving semiconductor layer A1 or the switching semiconductor layer A2 through contact holes penetrating the interlayer insulating layer 107.

The data line DL, the driving source electrode S1, the driving drain electrode D1, the switching source electrode S2, and the switching drain electrode D2 may be covered by an inorganic protective layer. The inorganic protective layer may be a single film or a multi-layer film of silicon oxide and silicon nitride. The inorganic protective layer may prevent or reduce instances of wires exposed in the non-display area NDA, for example, wires formed together during the same process as the data line DL, being damaged due to an etchant used to pattern a pixel electrode 310.

The driving voltage line PL may be arranged on a different layer from the data line DL. A first planarization layer 109 may be arranged between the driving voltage line PL and the data line DL, and the driving voltage line PL may be covered by a second planarization layer 111.

The driving voltage line PL may be a single film or a multi-layer film including at least one of aluminum (Al), copper (Cu), titanium (Ti), or an alloy thereof. According to some embodiments, the driving voltage line PL may be a three-layer film of Ti/Al/Ti.

Although FIG. 4 shows the driving voltage line PL arranged on the first planarization layer 109, embodiments according to the present disclosure are not limited thereto. According to some embodiments, the driving voltage line PL may be connected to a lower additional voltage line formed on the same layer as the data line DL through a through hole formed in the first planarization layer 109 and thus may decrease resistance.

The first planarization layer 109 and the second planarization layer 111 may be a single-layer or multi-layer film.

The first planarization layer 109 and the second planarization layer 111 may include an organic insulating material. As an example, the organic insulating material may include an imide-based polymer, a general commercial polymer such as polymethylmethacrylate (PMMA) or polystyrene (PS), a polymer derivative having a phenol-based group, an acryl-based polymer, an aryl ether-based polymer, an amide-based polymer, a fluorine-based polymer, a p-xylene-based polymer, a vinyl alcohol-based polymer, etc.

Also, the first planarization layer 109 and the second planarization layer 111 may include an inorganic insulating material. As an example, the inorganic insulating material may include silicon oxynitride, silicon oxide, silicon nitride, etc.

The organic light-emitting diode OLED having the pixel electrode 310, an opposite electrode 330, and the intermediate layer 320 between the pixel electrode 310 and the opposite electrode 330 and including an emission layer may be on the second planarization layer 111.

The pixel electrode 310 may be connected to a connection wire CL formed on the first planarization layer 109, and the connection wire CL may be connected to the driving drain electrode D1 of the driving thin-film transistor T1.

The pixel electrode 310 may be a transparent electrode or a reflective electrode.

When the pixel electrode 310 is a transparent electrode, the pixel electrode 310 may include a transparent conductive layer. The transparent conductive layer may be at least one selected from the group including indium tin oxide, indium zinc oxide, zinc oxide, indium oxide, indium gallium oxide, and aluminum zinc oxide. In this case, a semi-transmissive layer for improving luminescent efficiency may be further included in addition to the transparent conductive layer, and the semi-transmissive layer may be at least one selected from the group including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb) formed as a thin film of several to tens of micrometers (μm). When the pixel electrode 310 is a reflective electrode, the pixel electrode 310 may include a reflective film including silver (Ag), magnesium (Mg), aluminum (Al), platinum (Pt), palladium (Pd), gold (Au), nickel (Ni), neodymium (Nd), iridium (Ir), chromium (Cr), and a compound thereof, and a transparent conductive layer arranged on and/or under the reflective film. The transparent conductive layer may be at least one selected from the group including indium tin oxide, indium zinc oxide, zinc oxide, indium oxide, indium gallium oxide, and aluminum zinc oxide.

However, the disclosure is not limited thereto, and the pixel electrode 310 may include various materials, and a structure thereof may have various modifications, for example, a single-layer structure or a multi-layer structure.

The pixel-defining layer 113 may be arranged on the pixel electrode 310. The pixel-defining layer 113 has an opening exposing the pixel electrode 310 and thus defines an emission area of a pixel. Also, the pixel-defining layer 113 may prevent or reduce instances of an arc occurring at an end of the pixel electrode 310 by increasing a distance between an edge of the pixel electrode 310 and the opposite electrode 330. The pixel-defining layer 113 may include, for example, an organic material such as polyimide or hexamethyldisiloxane (HMDSO).

The intermediate layer 320 may include a low-molecular weight material or a polymer material. When the intermediate layer 320 includes a low-molecular weight material, the intermediate layer 320 may have a structure in which a hole injection layer, a hole transport layer, an emission layer, an electron transport layer, an electron injection layer, etc. are stacked in a single or complex structure. The intermediate layer 320 may include various organic materials, including copper phthalocyanine (CuPc), N,N'-Di(naphthalene-1-yl)-N,N'-diphenyl-benzidine (NPB), tris-8-hydroxyquinoline aluminum (Alq3), etc. The intermediate layer 320 may be formed by various methods such as vacuum deposition.

When the intermediate layer 320 includes a polymer material, the intermediate layer 320 may generally have a structure including a hole transport layer and an emission layer. In this regard, the hole transport layer may include poly(3,4-ethylenedioxythiophene) (PEDOT), and the emission layer may include a polymer material such as a polyphenylene vinylene (PPV)-based material, a polyfluorene-based material, etc. The intermediate layer 320 may be formed by various methods such as screen printing, inkjet printing, laser induced thermal imaging, etc. The intermediate layer 320 may be an integral layer over a plurality of pixel electrodes 310 or may be a layer patterned to correspond to each of the plurality of pixel electrodes 310.

The opposite electrode 330 may be arranged over the display area DA and may cover the display area DA. That is, the opposite electrode 330 may be integrally formed in a plurality of organic light-emitting diodes OLED to correspond to the plurality of pixel electrodes 310. The opposite electrode 330 is electrically connected to a second power voltage line 20 described below.

The opposite electrode 330 may be a transparent electrode or a reflective electrode. When the opposite electrode 330 is a transparent electrode, the opposite electrode 330 may include one or more materials selected from among silver (Ag), aluminum (Al), magnesium (Mg), lithium (Li), calcium (Ca), copper (Cu), lithium fluoride/calcium (LiF/Ca), lithium fluoride/aluminum (LiF/Al), MgAg, and CaAg, and may be in the form of a thin film having a thickness of several to tens of micrometers (μm). When the opposite electrode 330 is a reflective electrode, the opposite electrode 330 may include at least one selected from the group including silver (Ag), aluminum (Al), magnesium (Mg), lithium (Li), calcium (Ca), copper (Cu), lithium fluoride/calcium (LiF/Ca), lithium fluoride/aluminum (LiF/Al), MgAg, and CaAg. However, a structure and material of the opposite electrode 330 is not limited thereto and may have various modifications.

The spacer 115 may be arranged on the pixel-defining layer 113. Because the spacer 115 protrudes in a direction from the pixel-defining layer 113 toward the thin film encapsulation layer 400, the spacer 115 may maintain a gap between a mask and the substrate 100 during a process of depositing the intermediate layer 320 by using the mask and thus may prevent or reduce defects in which the intermediate layer 320 is stamped with or peeled off by the mask during the deposition process.

The spacer 115 may include an organic material such as polyimide or HMDSO. The spacer 115 may be arranged in the first and second dams 110 and 120 described below and be used to prevent or reduce penetration of moisture and form a step difference of the dams.

The organic light-emitting diode OLED may be relatively easily damaged by external moisture or oxygen and thus may be covered and protected by the thin film encapsulation layer 400.

The thin film encapsulation layer 400 may cover the display area DA and extend to the outside of the display area DA. The thin film encapsulation layer 400 may include at least one organic encapsulation layer and at least one inorganic encapsulation layer. According to some embodiments, the thin film encapsulation layer 400 may include a first inorganic encapsulation layer 410, an organic encapsulation layer 420, and a second inorganic encapsulation layer 430.

The first inorganic encapsulation layer 410 may cover the entire opposite electrode 330 and may include silicon oxide, silicon nitride and/or silicon oxynitride.

In some cases, other layers such as a capping layer may be arranged between the first inorganic encapsulation layer 410 and the opposite electrode 330. For example, the capping layer may include one or more from among silicon oxide, silicon nitride, zinc oxide, titanium oxide, zirconium oxide, indium tin oxide (ITO), indium zinc oxide (IZO), Alq3, CuPc, CBP, a-NPB, and ZiO2 to improve luminescent efficiency. According to some embodiments, the capping layer may cause a plasmon resonance phenomenon to occur with respect to light generated by the organic light-emitting diode OLED. For example, the capping layer may include nanoparticles. The capping layer may prevent or reduce instances of the organic light-emitting diode OLED being damaged by heat, plasma, etc. generated during a chemical vapor deposition process or sputtering process for forming the thin film encapsulation layer 400. For example, the capping layer may include an epoxy-based material including at least one of a bisphenol-type epoxy resin, an epoxidized butadiene resin, a fluorene-type epoxy resin, or a novolac epoxy resin.

According to some embodiments, a layer including lithium fluoride (LIF) may be arranged between the first inorganic encapsulation layer 410 and the capping layer.

Because the first inorganic encapsulation layer 410 is formed along a lower structure thereof, an upper surface of the first inorganic encapsulation layer 410 is not flat. The organic encapsulation layer 420 covers and planarizes the first inorganic encapsulation layer 410. An upper surface of the organic encapsulation layer 420 may be substantially flat in a portion corresponding to the display area DA.

The organic encapsulation layer 420 may include one or more materials selected from the group including polyethylene terephthalate, polyethylene naphthalate, polycarbonate, polyimide, polyethylene sulfonate, polyoxymethylene, polyarylate, and HMDSO.

The second inorganic encapsulation layer 430 may cover the organic encapsulation layer 420 and may include silicon oxide, silicon nitride and/or silicon oxynitride. By depositing the second inorganic encapsulation layer 430 to directly contact the first inorganic encapsulation layer 410 in an edge region of the display apparatus 1, the organic encapsulation layer 420 may be encapsulated not to be exposed to the outside of the display apparatus 1.

A right side of FIG. 4 is a cross-sectional view of the display apparatus 1, taken along the line IVA-IVB of FIG. 1.

Referring to the right side of FIG. 4, the buffer layer 101, the first gate insulating layer 103, the second gate insulating layer 105, and the interlayer insulating layer 107 may be arranged near an end of the substrate 100, and the second power voltage line 20 including a first conductive layer 21 and a second conductive layer 22 may be arranged on the interlayer insulating layer 107.

The first conductive layer 21 may include the same material as the data line DL, and the second conductive layer 22 may include the same material as the driving voltage line PL. The first conductive layer 21 may be directly connected to the second conductive layer 22 through a first contact hole CNT1 formed in the first planarization layer 109.

A connection layer 310*a* including the same material as the pixel electrode 310 may be arranged on the second conductive layer 22. The second conductive layer 22 may directly contact the connection layer 310*a*, and as a portion of the connection layer 310*a* contacts the opposite electrode 330, the second power voltage line 20 may provide the second power voltage ELVSS to the opposite electrode 330.

The second conductive layer 22 includes an extension portion 22*a* extending in a direction from the first contact hole CNT1 toward the display area DA. Because the extension portion 22*a* of the second conductive layer 22 extends toward the display area DA, in a vertical cross-sectional view of the substrate 100, a width W2 of the second conductive layer 22 may be greater than a width W1 of the first conductive layer 21.

Figure 5:
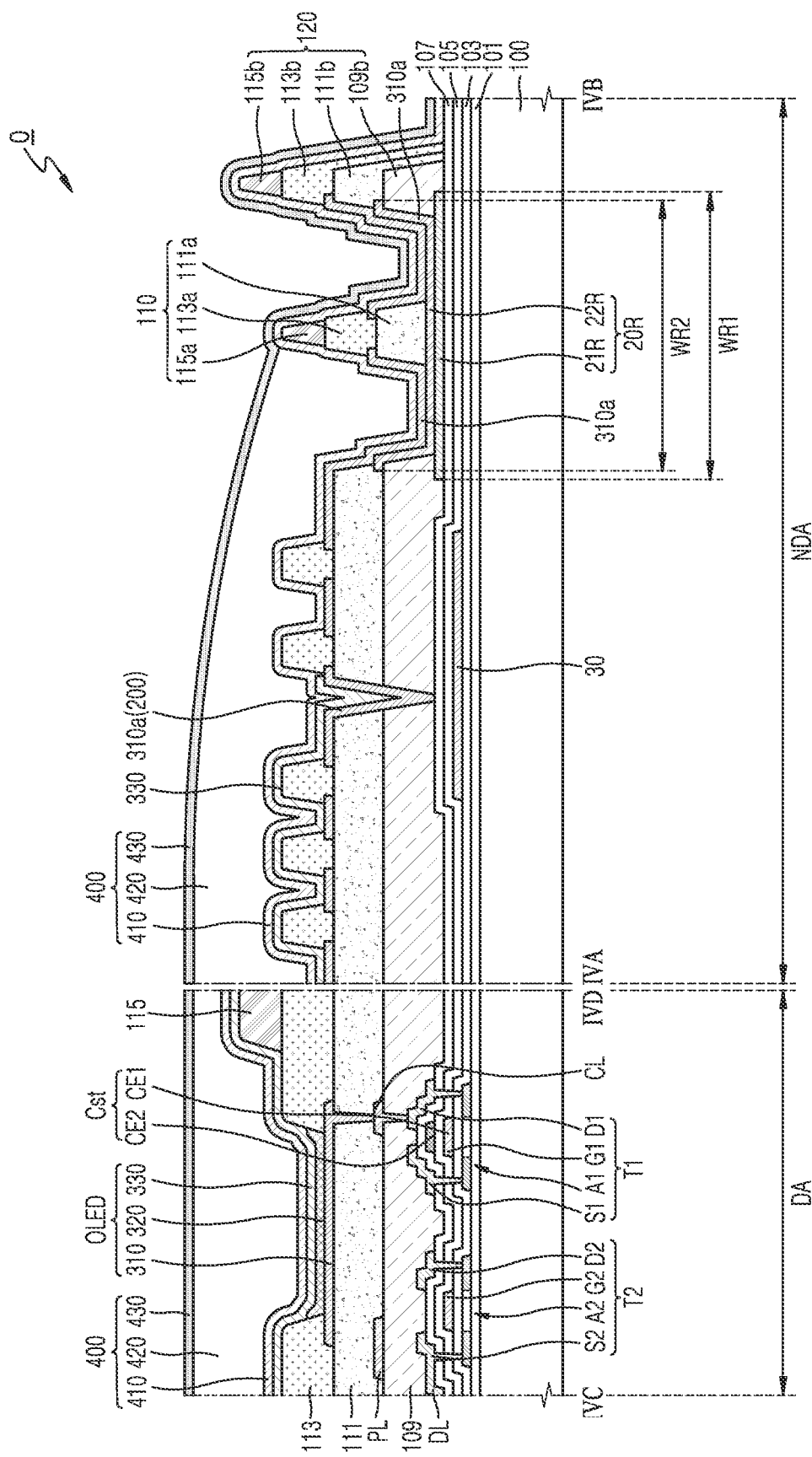
FIG. 5 is a schematic cross-sectional view of a display apparatus according to some embodiments.

Referring to FIG. 5, which is a schematic cross-sectional view of a display apparatus 0 according to a comparative example, a second power voltage line 20R including a first conductive layer 21R and a second conductive layer 22R is arranged. A width WR1 of the first conductive layer 21R of the comparative example is greater than the width W1 of the first conductive layer 21 according to some embodiments, and a width WR2 of the second conductive layer 22R of the comparative example is less than the width W2 of the second conductive layer 22 according to some embodiments.

Because the width W2 of the second conductive layer 22 according to some embodiments may be greater than the width WR2 of the second conductive layer 22R of the comparative example, although the width W1 of the first conductive layer 21 according to some embodiments is less than the width WR1 of the first conductive layer 21R of the comparative example, a total resistance of the second power voltage line 20 according to some embodiments does not increase more than a total resistance of the second power voltage line 20R of the comparative example because a total effective width W1+W2 of the second power voltage line 20 according to some embodiments is not less than a total effective width WR1+WR2 of the second power voltage line 20R of the comparative example. Thus, according to some embodiments, a dead space occupied by the first conductive layer 21 may be reduced because a width of the first conductive layer 21 may be reduced compared to an embodiment of the comparative example.

Referring to FIG. 4, the first dam 110 and the second dam 120 are arranged at a position overlapping ends of the second power voltage line 20. The first dam 110 is closer to the display area DA than the second dam 120 is.

The first dam 110 may include a first layer 109*a* including the same material as the first planarization layer 109, a second layer 111*a* including the same material as the second planarization layer 111, a third layer 113*a* including the same material as the pixel-defining layer 113, and a fourth layer 115*a* including the same material as the spacer 115. The second conductive layer 22 may be arranged between the first layer 109*a* and the second layer 111*a* to extend toward the display area DA.

The second dam 120 may include a first layer 109*b* including the same material as the first planarization layer 109, a second layer 111*b* including the same material as the second planarization layer 111, a third layer 113*b* including the same material as the pixel-defining layer 113, and a fourth layer 115*b* including the same material as the spacer 115.

According to some embodiments, the second layer 111*b* of the second dam 120 may be formed higher than the second layer 111*a* of the first dam 110 by using, for example, a halftone process. As a second height h2 of the second dam 120 is greater than a first height h1 of the first dam 110, an organic material of the organic encapsulation layer 420 may be prevented from overflowing the second dam 120 and forming an edge tail. In addition, during a process of depositing the intermediate layer 320 by using a mask, a gap between the mask and the substrate 100 may be maintained to prevent or reduce defects in which the intermediate layer 320 is stamped with or peeled off by the mask during the deposition process.

The first layer 109*a* of the first dam 110 and the first layer 109*b* of the second dam 120 may cover ends of the first conductive layer 21 and thus may prevent or reduce degradation of the first conductive layer 21. For example, as an end of the first layer 109*a* of the first dam 110 and an end of the first layer 109*b* of the second dam 120 constitute an interface of the first contact hole CNT1 formed in the first planarization layer 109, both of the first dam 110 and the second dam 120 overlap ends of the first conductive layer 21.

According to the comparative example of FIG. 5, while the first layer 109*b* of the second dam 120 overlaps an end of the first conductive layer 21R, the entire first dam 110 is arranged above the first conductive layer 21R, and thus, the first dam 110 does not overlap an end of the first conductive layer 21R. Thus, in the display apparatus 1 according to some embodiments, degradation of the first conductive layer 21 may be prevented more effectively compared to the comparative example because all both ends of the first conductive layer 21 are clad with the first layer 109*a* of the first dam 110 and the first layer 109*b* of the second dam 120.

A second contact hole CNT2 is formed in the first planarization layer 109 between the display area DA and the first contact hole CNT1 in a direction horizontal to the substrate 100. The extension portion 22*a* of the second conductive layer 22 covers an interface of the second contact hole CNT2 and extends toward the display area DA.

In the second planarization layer 111 on the first planarization layer 109, a third contact hole CNT3 is formed at a position overlapping the second contact hole CNT2. The connection layer 310*a* covers an interface of the third contact hole CNT3 and extends toward the display area DA. The connection layer 310*a* may include the same material as the pixel electrode 310 but may be electrically insulated from the pixel electrode 310 of the display area DA.

Because the first planarization layer 109 and the second planarization layer 111 are removed at a position where the second contact hole CNT2 and the third contact hole CNT3 overlap each other, a valley of an insulating layer is formed. In the valley, the extension portion 22a of the second conductive layer 22 and the connection layer 310a cover interfaces of the second contact hole CNT2 and the third contact hole CNT3, respectively, and constitute a valley cover layer 200. Because the extension portion 22a of the second conductive layer 22 and the connection layer 310a contact each other in the valley, instances of impurities penetrating from a side surface of the substrate 100 and spreading to the display area DA may be prevented or reduced.

A plurality of first holes H1 may be formed in the extension portion 22a of the second conductive layer 22 to smoothly emit gas generated from the first planarization layer 109. A plurality of second holes H2 may be formed in the connection layer 310a to smoothly emit gas generated from the second planarization layer 111.

An organic insulating layer including the same material as the pixel-defining layer 113 is formed on the second planarization layer 111, and a plurality of third holes H3 are formed in the organic insulating layer to form a plurality of first convex portions 113c. A third hole H3 may overlap the connection layer 310a, and a first convex portion 113c may overlap a second hole H2. A third height h3 of the second planarization layer 111 under the first convex portion 113c may be greater than the first height h1 of the second layer 111a included in the first dam 110.

The opposite electrode 330 extending from the display area DA may be on the first convex portion 113c, and the opposite electrode 330 may extend to the valley. The opposite electrode 330 is connected to the connection layer 310a between first convex portions 113c and is connected to the connection layer 310a of the valley cover layer 200 in the valley. Because the connection layer 310a is connected to the second conductive layer 22, and the second conductive layer 22 is connected to the first conductive layer 21 in the first contact hole CNT1, the second power voltage line 20 may be configured to supply a second power voltage to the opposite electrode 330.

In a direction parallel to the substrate 100, a bank portion 140 including a second convex portion 113d is between the valley and the first dam 110. The second convex portion 113d may be formed of the same material as the first convex portion 113c by the same process.

According to some embodiments, in a vertical cross-sectional view of the substrate 100, the bank portion 140 has the first planarization layer 109, the second planarization layer 111, and the second convex portion 113d, and the extension portion 22a of the second conductive layer 22 in which the plurality of first holes H1 are formed and the connection layer 310a in which the plurality of second holes H2 are formed are between the first planarization layer 109 and the second planarization layer 111. In a vertical cross-sectional view of the substrate 100, a first hole H1 and a second hole H2 may overlap each other, thereby smoothly emit gas generated from the first planarization layer 109 and the second planarization layer 111.

A fourth height h4 of the second planarization layer 111 arranged in a lower portion of the bank portion 140 is less than the second height h2 of the second layer 111b of the second dam 120, and thus, an overall height of the bank portion 140 is less than an overall height of the second dam 120. However, because a plurality of second convex portions 113d are formed in the bank portion 140, a flow rate of an organic material may be reduced during formation of the thin film encapsulation layer 400 to control an organic material formation rate.

Circuit wiring 30 may be further arranged below the valley cover layer 200. Wires of various circuit portions such as an emission control driver and a scan line driver may be arranged in the circuit wiring 30. A space margin in which the circuit wiring 30 may be arranged may increase as much as a dead space created by reducing the width W1 of the first conductive layer 21, and thus, the degree of freedom in circuit design may improve. Although FIG. 4 shows the circuit wiring 30 as one layer formed of the same material as the gate electrode G1, this is an example, and the disclosure is not limited thereto. The circuit wiring 30 is not limited to being formed of the same material or on the same layer as the gate electrode G1 and may be formed as a plurality of layers instead of one layer.

According to one or more of the above-described embodiments, a dead space may be reduced by reducing the width W1 of the first conductive layer 21. In addition, even when the width W1 of the first conductive layer 21 is reduced, the total effective width W1+W2 of the second power voltage line 20 may be increased by increasing the width W2 of the second conductive layer 22, and thus, resistance of the second power voltage line 20 may be reduced. In addition, an organic material rate may be controlled by forming the bank portion 140, and out-gassing may be smoothly performed by overlapping the first hole H1 and the second hole H2.

Figure 6A:
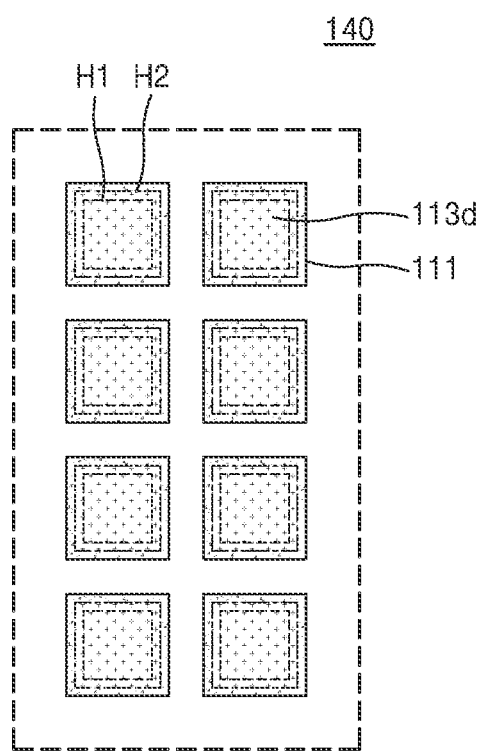
FIGS. 6A to 6C are schematic plan views illustrating embodiments of various structures in which a first hole and a second hole of a bank portion overlap each other.
Figure 6B:
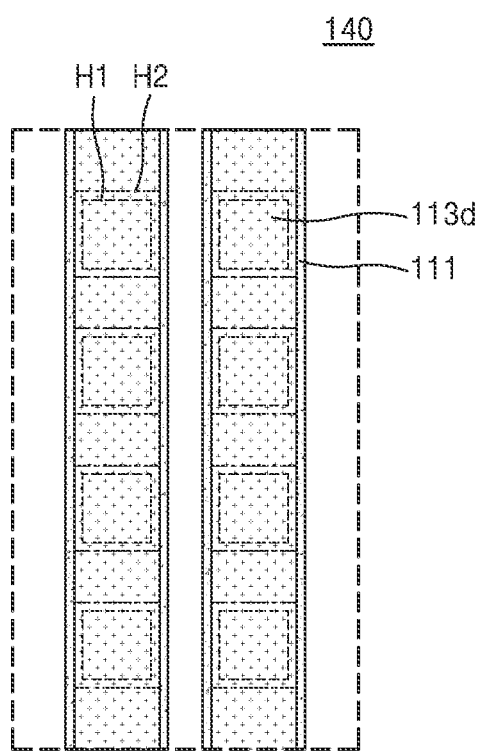
Figure 6C:
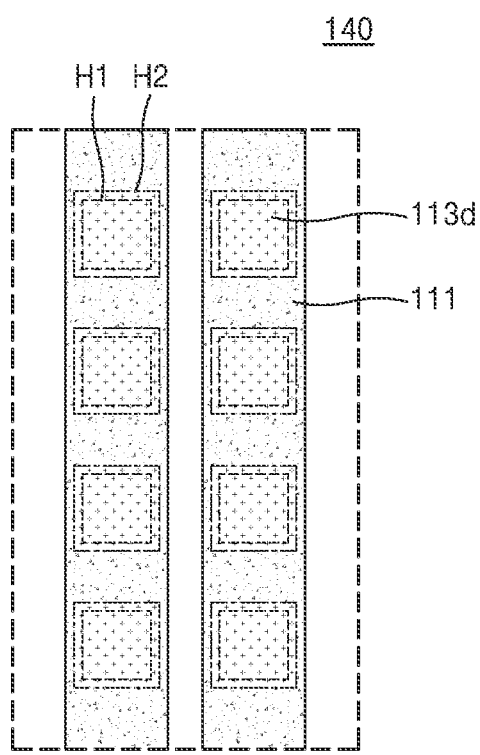

FIGS. 6A to 6C are schematic plan views illustrating embodiments of various structures in which the first hole H1 and the second hole H2 of the bank portion 140 overlap each other.

Referring to FIG. 6A, in a structure in which the first hole H1 and the second hole H2 overlap each other in a cross-sectional view as in the embodiments of FIG. 4, embodiments in which the second planarization layer 111 and the second convex portion 113d overlap the first hole H1 and the second hole H2 and are formed as an island in a plan view is illustrated. The description 'formed as an island' may be construed as meaning that, for example, the second convex portion 113d has a shape that is not connected to other neighboring second convex portions 113d and is spaced apart from the other neighboring second convex portions 113d in all directions. As the second planarization layer 111 and the second convex portion 113d are formed as a plurality of islands to form curvature in a plan view, a flow rate of an organic material may be controlled during formation of the organic encapsulation layer 420 to improve a profile of an edge tail due to the organic material.

Referring to FIG. 6B, in a structure in which the first hole H1 and the second hole H2 overlap each other in a cross-sectional view as in the embodiments of FIG. 4, embodiments in which the second planarization layer 111 and the second convex portion 113d overlap the first hole H1 and the second hole H2 and are formed as a bar in a plan view is illustrated. The description 'formed as a bar' may be construed as meaning that, for example, the second convex portion 113d has a shape that is not connected to another neighboring second convex portion 113d and is spaced apart from the other neighboring second convex portion 113d in one direction. For example, the second planarization layer 111 may have a shape that is not connected to another neighboring second planarization layer 111 and is spaced apart from the other neighboring second planarization layer 111 in one direction. As the second planarization layer 111 and the second convex portion 113d are formed as a plurality of parallel bars, a flow rate of an organic material may be controlled during formation of the organic encapsulation layer 420 to improve a profile of an edge tail due to the organic material.

Referring to FIG. 6C, in a structure in which the first hole H1 and the second hole H2 overlap each other in a cross-sectional view as in the embodiments of FIG. 4, embodiments in which the second planarization layer 111 is formed as a bar and the second convex portion 113*d* is formed as an island in a plan view is illustrated. As a plurality of parallel bars formed by the second planarization layer 111 and a plurality of islands formed by the second convex portion 113*d* form curvature in a plan view, a flow rate of an organic material may be controlled during formation of the organic encapsulation layer 420 to improve a profile of an edge tail due to the organic material. According to some embodiments as illustrated in FIG. 6C, the second planarization layer 111 may be formed as an island, and the second convex portion 113*d* may be formed as a bar.

Figure 7:
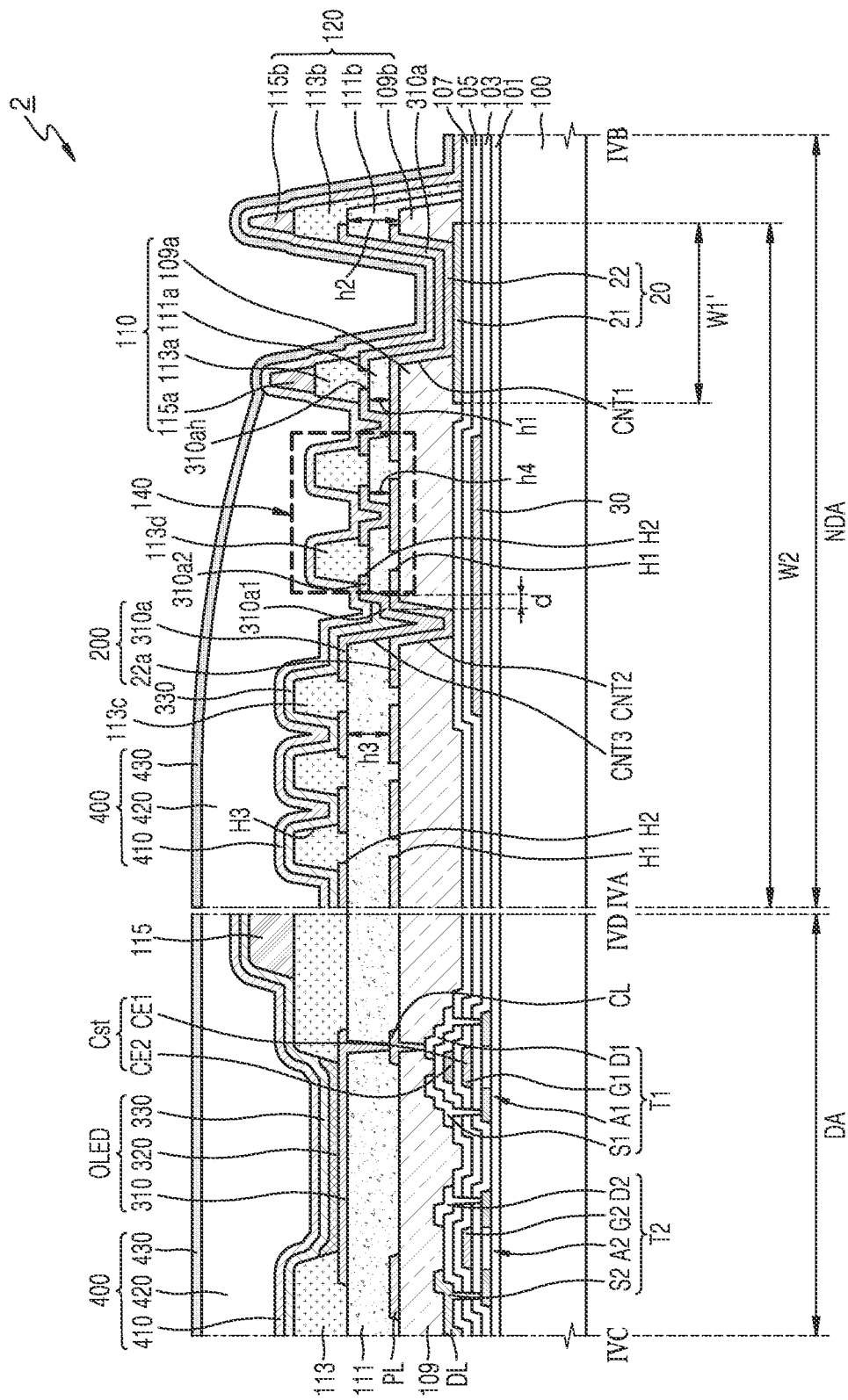
FIG. 7 is a schematic cross-sectional view of a display apparatus according to some embodiments.

FIG. 7 is a schematic cross-sectional view of a display apparatus 2 according to some embodiments.

A left side of FIG. 7 is a schematic cross-sectional view of the pixel P, taken along the line IVC-IVD of FIG. 3 and is the same as the embodiments of FIG. 4 described above.

A right side of FIG. 7 is a cross-sectional view of the display apparatus 1, taken along the line IVA-IVB of FIG. 1, and differences from the embodiments of FIG. 4 described above will be mainly described hereinafter.

According to some embodiments as illustrated in FIG. 7, a shape of the connection layer 310*a* between a valley and the bank portion 140 is different from that in the embodiments of FIG. 4. In the connection layer 310*a* according to some embodiments, a portion extending in a direction from the valley toward the bank portion 140 has a 2-tier step shape. That is, the connection layer 310*a* extending in a direction from the valley toward the bank portion 140 has a stepped shape in which a first tier 310*a* 1 on the second conductive layer 22 and a second tier 310*a* 2 on the second planarization layer 111 are connected to each other. When the third contact hole CNT3 is formed in the second planarization layer 111, a structure of the connection layer 310*a* may be formed in a stepped shape by shifting an interface of the third contact hole CNT3 close to the bank portion 140 by a certain distance d in a direction toward the bank portion 140.

According to some embodiments as illustrated in FIG. 7, unlike the embodiments of FIG. 4, a hole 310*ah* of the connection layer 310*a* formed on the second layer 111*a* of the first dam 110 completely overlaps the first conductive layer 21. Although it is shown in the embodiments of FIG. 7 that a width W1' of the first conductive layer 21 is a little greater than the width W1 of the first conductive layer 21 of the embodiments of FIG. 4 so that the hole 310*ah* of the connection layer 310*a* completely overlaps the first conductive layer 21, the disclosure is not limited thereto. Without increasing the width W1 of the first conductive layer 21 through a design change, a center of the hole 310*ah* of the connection layer 310*a* may be completely overlapped with the first conductive layer 21.

Figure 8:
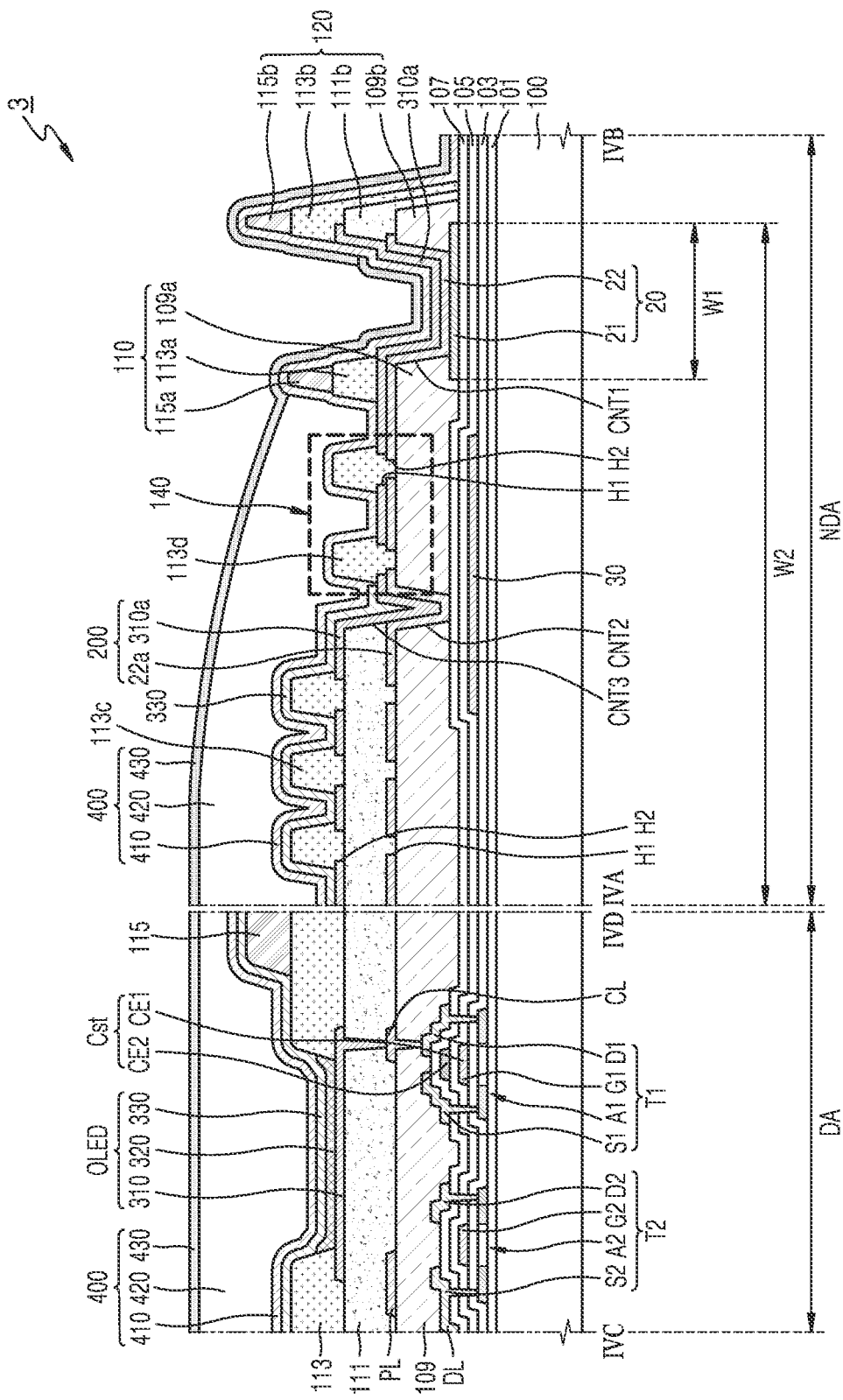
FIG. 8 is a schematic cross-sectional view of a display apparatus according to some embodiments.

FIG. 8 is a schematic cross-sectional view of a display apparatus 3 according to some embodiments.

A left side of FIG. 8 is a schematic cross-sectional view of the pixel P, taken along the line IVC-IVD of FIG. 3 and is the same as the embodiments of FIG. 4 described above.

A right side of FIG. 8 is a cross-sectional view of the display apparatus 1, taken along the line IVA-IVB of FIG. 1, and differences from the embodiments of FIG. 4 described above will be mainly described hereinafter.

The embodiments of FIG. 8 are different from the embodiments of FIG. 4 in terms of structures of the bank portion 140 and the first dam 110. According to some embodiments, the bank portion 140 and the first dam 110 do not include an insulating layer including the same material as the second planarization layer 111.

According to some embodiments, the first dam 110 may include the first layer 109*a* including the same material as the first planarization layer 109, the third layer 113*a* including the same material as the pixel-defining layer 113, and the fourth layer 115*a* including the same material as the spacer 115.

In a vertical cross-sectional view of the substrate 100, the bank portion 140 has the first planarization layer 109 and the second convex portion 113*d*, and the second conductive layer 22 having the plurality of first holes H1 and the connection layer 310*a* having the plurality of second holes H2 are between the first planarization layer 109 and the second convex portion 113*d*. Unlike the embodiments of FIG. 4, in a vertical cross-sectional view of the substrate 100, the first hole H1 and the second hole H2 of the present embodiments may directly overlap each other without the second planarization layer 111 therebetween, and thus, gases generated from the first planarization layer 109 and the second planarization layer 111 may be more smoothly emitted.

Figure 9:
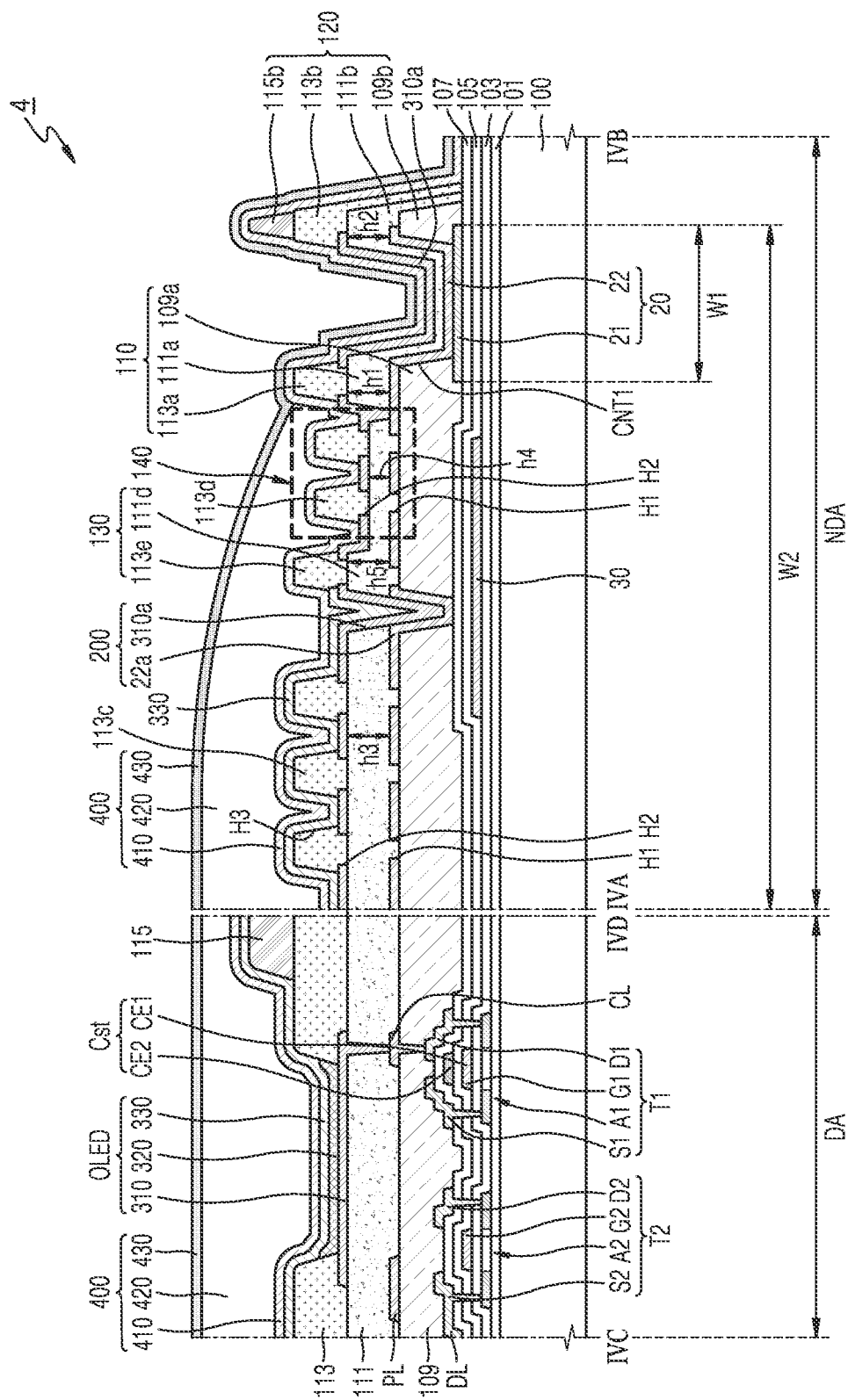
FIG. 9 is a schematic cross-sectional view of a display apparatus according to some embodiments.

FIG. 9 is a schematic cross-sectional view of a display apparatus 4 according to some embodiments.

A left side of FIG. 9 is a schematic cross-sectional view of the pixel P, taken along the line IVC-IVD of FIG. 3 and is the same as the embodiments of FIG. 4 described above.

A right side of FIG. 9 is a cross-sectional view of the display apparatus 1, taken along the line IVA-IVB of FIG. 1, and differences from the embodiments of FIG. 4 described above will be mainly described hereinafter.

In the embodiments of FIG. 9, unlike the embodiments of FIG. 4, a third dam 130 may be further arranged between the valley cover layer 200 and the bank portion 140.

The third dam 130 is arranged on the first planarization layer 109 and includes a second layer 111*d* including the same material as the second planarization layer 111 and a third layer 113*e* including the same material as the pixel-defining layer 113.

A fifth height h5 of the second layer 111*d* of the third dam 130 is the same as the first height h1 of the first dam 110 and the second height h2 of the second dam 120 and is greater than the fourth height h4 of the second planarization layer 111 formed in the bank portion 140. As an overall height of the third dam 130 is formed greater than an overall height of the bank portion 140, an operation of controlling a flow rate of an organic material during formation of the organic encapsulation layer 420 may be added.

In addition, according to some embodiments, the first dam 110 includes the first layer 109*a* including the same material as the first planarization layer 109, the second layer 111*a* including the same material as the second planarization layer 111, and the third layer 113*a* including the same material as the pixel-defining layer 113, and thus, unlike the embodiments of FIG. 4 described above, a layer including the same material as the spacer 115 is excluded. However, the disclosure is not limited thereto, and a layer including the same material as the spacer 115 may be further included.

According to some embodiments, on the second power voltage line 20, the second conductive layer 22 and the connection layer 310*a* do not directly contact each other, and the second planarization layer 111 is arranged therebetween. Even when the second planarization layer 111 is arranged therebetween, because the second conductive layer 22 extending to the display area DA is connected to the connection layer 310a in a valley, a second power voltage may be transmitted to the opposite electrode 330. According to some embodiments, the second planarization layer 111 partially remains on the second conductive layer 22, and thus, the second conductive layer 22 may be prevented from being damaged during an etching process for removing all of the second planarization layer 111.

Figure 10:
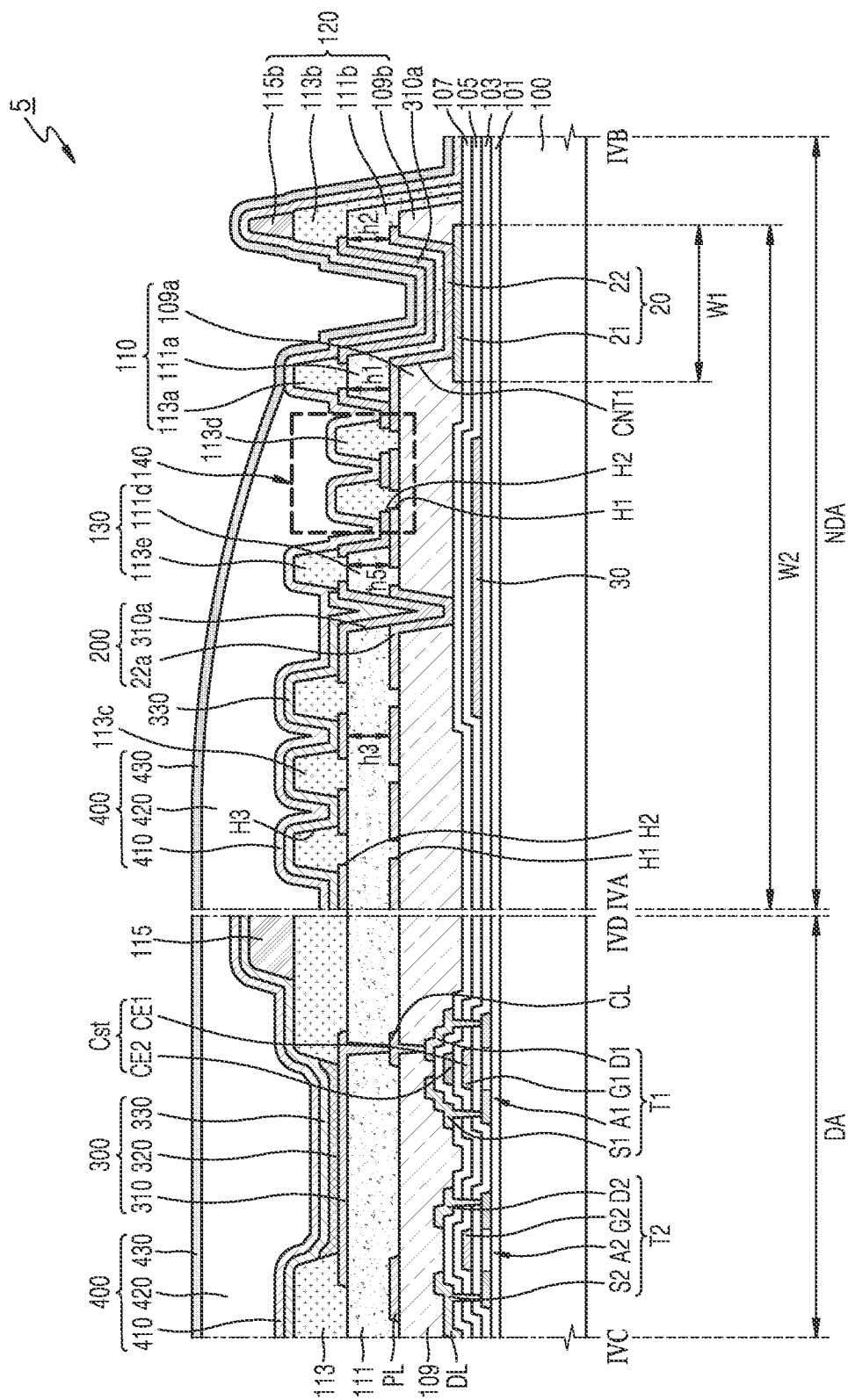
FIG. 10 is a schematic cross-sectional view of a display apparatus according to some embodiments.

FIG. 10 is a schematic cross-sectional view of a display apparatus 5 according to some embodiments.

A left side of FIG. 10 is a schematic cross-sectional view of the pixel P, taken along the line IVC-IVD of FIG. 3 and is the same as the embodiments of FIG. 9 described above.

A right side of FIG. 10 is a cross-sectional view of the display apparatus 1, taken along the line IVA-IVB of FIG. 1, and differences from the embodiments of FIG. 9 described above will be mainly described hereinafter.

The embodiments of FIG. 10 are different from the embodiments of FIG. 9 in terms of structures of the bank portion 140 and the first dam 110. According to some embodiments, the bank portion 140 and the first dam 110 do not include an insulating layer including the same material as the second planarization layer 111. However, the third dam 130 includes the second layer 111d including the same material as the second planarization layer 111 as in the embodiments of FIG. 9.

According to some embodiments, the first dam 110 may include the first layer 109a including the same material as the first planarization layer 109, the second layer 111a including the same material as the second planarization layer 111, and the third layer 113a including the same material as the pixel-defining layer 113.

In a vertical cross-sectional view of the substrate 100, the bank portion 140 has the first planarization layer 109 and the second convex portion 113d, and the second conductive layer 22 having the plurality of first holes H1 and the connection layer 310a having the plurality of second holes H2 are between the first planarization layer 109 and the second convex portion 113d. Unlike the embodiments of FIG. 9, in a vertical cross-sectional view of the substrate 100, the first hole H1 and the second hole H2 of the present embodiments may directly overlap each other without the second planarization layer 111 therebetween, and thus, gases generated from the first planarization layer 109 and the second planarization layer 111 may be more smoothly emitted.

Figure 11:
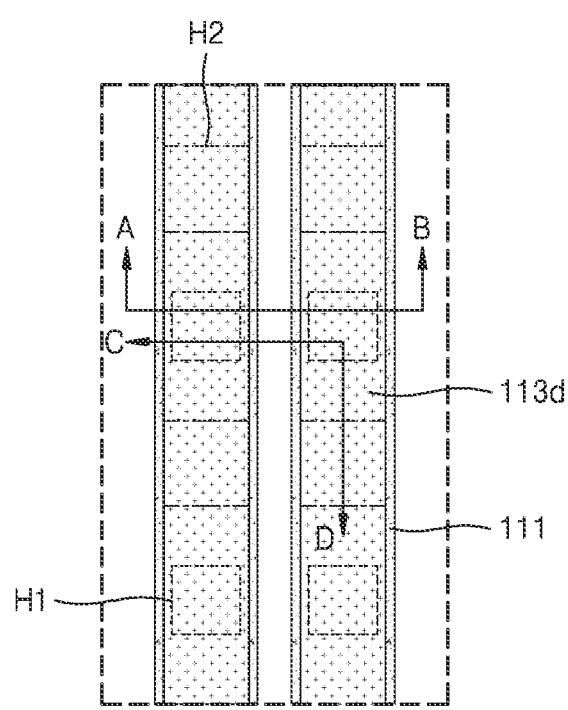
FIG. 11 is a plan view illustrating embodiments in which a first hole and a second hole of a bank portion do not overlap each other.
Figure 12:
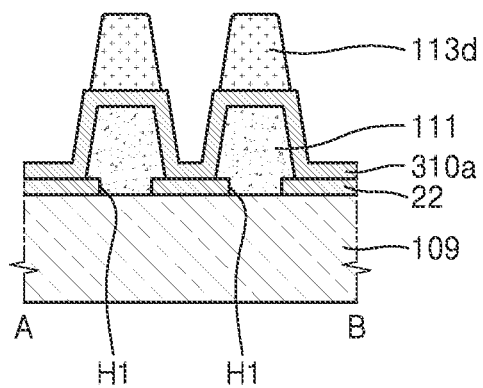
FIG. 12 is a cross-sectional view taken along the line A-B of FIG. 11.
Figure 13:
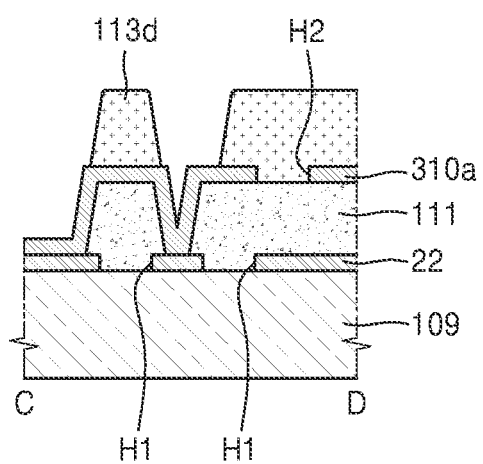
FIG. 13 is a cross-sectional view taken along the line C-D of FIG. 11.

FIG. 11 is a plan view illustrating embodiments in which the first hole H1 and the second hole H2 of the bank portion 140 do not overlap each other. FIG. 12 is a cross-sectional view taken along the line A-B of FIG. 11. FIG. 13 is a cross-sectional view taken along the line C-D of FIG. 11.

Referring to FIGS. 11 to 13, the first hole H1 and the second hole H2 do not overlap each other in a cross-sectional view but alternate with each other in a plan view. The second planarization layer 111 and the second convex portion 113d are formed as a plurality of parallel bars in a plan view.

Although the present embodiments are different from the above-described embodiments in that the first hole H1 and the second hole H2 do not overlap each other in a cross-sectional view, the second planarization layer 111 and the second convex portion 113d may be formed as a plurality of parallel bars, and thus, a flow rate of an organic material may be controlled during formation of the organic encapsulation layer 420 to improve a profile of an edge tail due to the organic material.

Although FIG. 11 shows a structure in which the first hole H1 and the second hole H2 are sequentially alternately arranged, embodiments according to the present disclosure re not limited thereto. According to some embodiments, various modifications may be made, for example, while two first holes H1 are continuously formed in a row, and two second holes H2 are continuously formed in a row, the two first holes H1 and the two second holes H2 may be alternately arranged. In addition, although it is shown in FIG. 11 that a size of the first hole H1 and a size of the second hole H2 are substantially the same as each other, embodiments according to the present disclosure re not limited thereto, and a size of the first hole H1 and a size of the second hole H2 may be different from each other.

Figure 14:
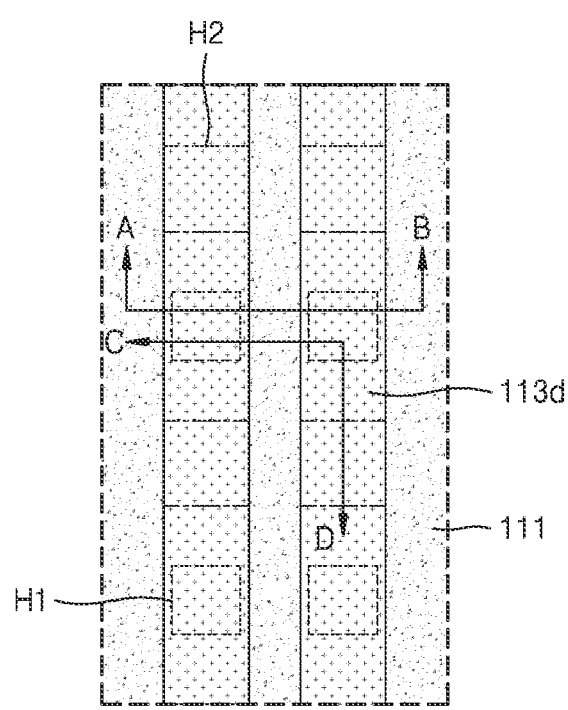
FIG. 14 is a plan view illustrating according to some embodiments in which a first hole and a second hole of a bank portion do not overlap each other.
Figure 15:
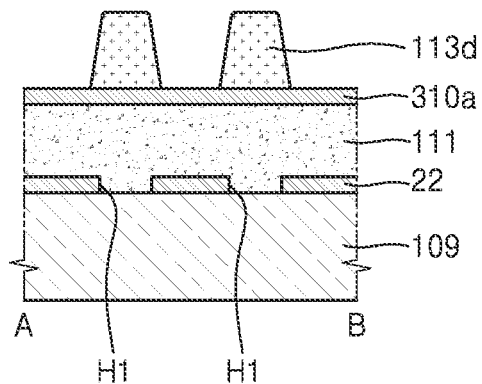
FIG. 15 is a cross-sectional view taken along the line A-B of FIG. 14.
Figure 16:
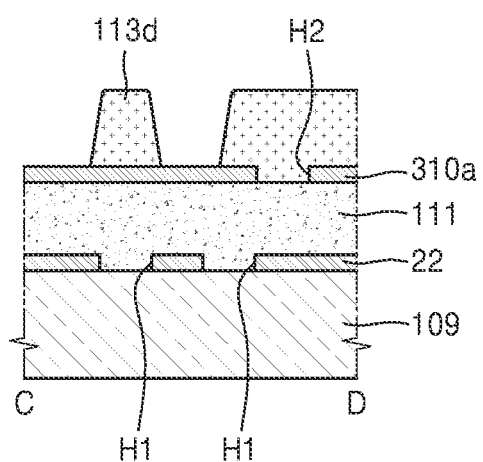
FIG. 16 is a cross-sectional view taken along the line C-D of FIG. 14.

FIG. 14 is a plan view illustrating other embodiments in which the first hole H1 and the second hole H2 of the bank portion 140 do not overlap each other. FIG. 15 is a cross-sectional view taken along the line A-B of FIG. 14. FIG. 16 is a cross-sectional view taken along the line C-D of FIG. 14.

Referring to FIGS. 14 to 16, the first hole H1 and the second hole H2 do not overlap each other in a cross-sectional view but alternate with each other in a plan view. The second planarization layer 111 is formed as one pattern without discontinuity, and the second convex portion 113d including the same material as the pixel-defining layer 113 is formed as a plurality of bars.

Although the present embodiments are different from the above-described embodiments in that the first hole H1 and the second hole H2 do not overlap each other in a cross-sectional view, the second convex portion 113d including the same material as the pixel-defining layer 113 and constituting the bank portion 140 may be formed as a plurality of bars, and thus, a flow rate of an organic material may be controlled during formation of the organic encapsulation layer 420 to improve a profile of an edge tail due to the organic material.

Although FIG. 14 shows a structure in which the first hole H1 and the second hole H2 are sequentially alternately arranged, the disclosure is not limited thereto. According to some embodiments, various modifications may be made, for example, while two first holes H1 are continuously formed in a row, and two second holes H2 are continuously formed in a row, the two first holes H1 and the two second holes H2 may be alternately arranged. In addition, although it is shown in FIG. 14 that a size of the first hole H1 and a size of the second hole H2 are substantially the same as each other, the disclosure is not limited thereto, and a size of the first hole H1 and a size of the second hole H2 may be different from each other.

According to one or more embodiments, as a width of a second conductive layer constituting a power voltage line is greater than that of a first conductive layer, and the second conductive layer directly contacts a connection layer connected to a cathode in a via valley, a dead space may be reduced by reducing a width of a second power supply line without a significant increase in resistance. Also, a monomer reflow rate may be controlled by forming a plurality of convex portions between the via valley and a dam, and an outgassing effect may be enhanced by arranging holes respectively formed in the second conductive layer and the connection layer in an overlapping or non-overlapping manner.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
a plurality of pixels on a substrate and each comprising a first electrode, an intermediate layer, and a second electrode, the intermediate layer comprising an emission layer;
a display area comprising the plurality of pixels;
a first conductive layer outside the display area;
a first planarization layer comprising a first contact hole exposing an upper surface of the first conductive layer, and a second contact hole between the display area and the first contact hole;
a second conductive layer connected to the first conductive layer through the first contact hole;
a second planarization layer on the first planarization layer and comprising a third contact hole formed at a position overlapping the second contact hole;
a connection layer directly contacting the second conductive layer at a position where the second contact hole and the third contact hole overlap each other,
wherein the second contact hole is spaced apart from the first contact hole in a direction horizontal to the substrate,
an organic insulating layer on the second planarization layer;
a first dam comprising the first and second planarization layers and the organic insulating layer and covering a first end of the first conductive layer;
a second dam comprising the first and second planarization layers and the organic insulating layer and covering a second end of the first conductive layer.

2. The display apparatus of claim 1, wherein the second conductive layer is in the first contact hole and between the first contact hole and the display area,
wherein a width of the second conductive layer is greater than a width of the first conductive layer.

3. The display apparatus of claim 1, wherein the connection layer directly contacts the second electrode at the position where the second contact hole and the third contact hole overlap each other.

4. The display apparatus of claim 3, wherein, in the first contact hole, the connection layer overlaps the first conductive layer and the second conductive layer.

5. The display apparatus of claim 4, wherein, in the first contact hole, the connection layer directly contacts the second conductive layer.

6. The display apparatus of claim 4, wherein, in the first contact hole, the second planarization layer is between the connection layer and the second conductive layer.

7. The display apparatus of claim 1, wherein a height from a surface of the substrate to a top of the second dam is greater than a height from the surface of the substrate to a top of the first dam.

8. The display apparatus of claim 1, further comprising:
a valley where the second contact hole and the third contact hole overlap each other; and
a bank portion between the valley and the first dam, wherein the bank portion comprises a plurality of convex portions comprising an organic insulating layer.

9. The display apparatus of claim 8, wherein, in a vertical cross-sectional view of the substrate, the bank portion has a structure in which the first planarization layer, the second conductive layer comprising a first hole, the second planarization layer, the connection layer comprising a second hole, and the plurality of convex portions are sequentially stacked.

10. The display apparatus of claim 9, wherein the first hole and the second hole overlap each other in the vertical cross-sectional view of the substrate.

11. The display apparatus of claim 9, wherein each of the plurality of convex portions is not connected to other convex portions and is spaced apart from the other convex portions in all directions.

12. The display apparatus of claim 9, wherein each of the plurality of convex portions is not connected to other convex portions and is spaced apart from the other convex portions in all directions,
wherein the second planarization layer is not connected to another second planarization layer and is spaced apart from the other second planarization layer in one direction.

13. The display apparatus of claim 9, wherein each of the plurality of convex portions is not connected to another convex portion and is spaced apart from the other convex portion in one direction,
wherein the second planarization layer is not connected to another second planarization layer and is spaced apart from the other second planarization layer in one direction.

14. The display apparatus of claim 8, wherein, in a vertical cross-sectional view of the substrate, the bank portion has a structure in which the first planarization layer, the second conductive layer comprising a first hole, the connection layer comprising a second hole, and the plurality of convex portions are sequentially stacked.

15. The display apparatus of claim 14, wherein the first hole and the second hole are connected to each other to allow direct penetration.

16. The display apparatus of claim 1, further comprising:
a valley where the second contact hole and the third contact hole overlap each other; and
a bank portion between the valley and the first dam,
wherein a third dam having a height greater than that of the bank portion is further between the valley and the bank portion.

17. The display apparatus of claim 16, wherein the second planarization layer constitutes the third dam and the bank portion,
wherein a height of the second planarization layer included in the third dam is greater than a height of the second planarization layer included in the bank portion.

18. The display apparatus of claim 1, further comprising a thin film encapsulation layer covering the display area, the thin film encapsulation layer comprising at least one inorganic encapsulation layer and at least one organic encapsulation layer.

19. The display apparatus of claim 18, wherein the at least one inorganic encapsulation layer comprises a first inorganic encapsulation layer and a second inorganic encapsulation layer,
wherein the at least one organic encapsulation layer is between the first inorganic encapsulation layer and the second inorganic encapsulation layer.

20. The display apparatus of claim 19, wherein the first inorganic encapsulation layer and the second inorganic encapsulation layer directly contact each other outside a second dam.

21. A display apparatus comprising:
a substrate;

a display area over the substrate and comprising a plurality of pixels;

a non-display area outside the display area;

a first dam surrounding the display area;

a second dam outside the first dam and surrounding the first dam;

a power voltage line comprising a first conductive layer between the first dam and the second dam, and a second conductive layer directly contacting the first conductive layer and having a width greater than that of the first conductive layer; and a third conductive layer directly contacting the second conductive layer in a valley where contact holes respectively formed in at least two insulating layers overlap each other between the display area and the first dam, wherein, at the valley, the second conductive layer does not directly contact the first conductive layer, and wherein a bank portion comprising a plurality of convex portions is between the valley and the first dam, wherein the bank portion has a height less than that of the first dam.

22. The display apparatus of claim 21, wherein each of the plurality of pixels comprises a first electrode, an emission layer on the first electrode, and a second electrode on the emission layer and commonly arranged in the plurality of pixels, wherein the second electrode extends to the non-display area and directly contacts the third conductive layer between the display area and the first dam.

23. The display apparatus of claim 21, wherein a third dam is between the valley and the bank portion, wherein the third dam has a height greater than that of the bank portion.

24. The display apparatus of claim 21, further comprising a thin film encapsulation layer covering the display area, wherein the thin film encapsulation layer comprises a first inorganic encapsulation layer, a second inorganic encapsulation layer, and an organic encapsulation layer between the first inorganic encapsulation layer and the second inorganic encapsulation layer, wherein the first inorganic encapsulation layer and the second inorganic encapsulation layer directly contact each other outside the second dam.

* * * * *